US005477555A

United States Patent [19]
Debeau et al.

[11] Patent Number: 5,477,555
[45] Date of Patent: Dec. 19, 1995

[54] METHOD AND DEVICE FOR GENERATING OPTICAL PULSES

[75] Inventors: Jean Debeau, Lannion; Rémi Boittin, Ploulech, both of France

[73] Assignee: France Telecom Etablissement Autonome de Droit Public, Paris, France

[21] Appl. No.: 184,391

[22] Filed: Jan. 21, 1994

[30] Foreign Application Priority Data

Jan. 28, 1993 [FR] France .................................. 93 00870

[51] Int. Cl.$^6$ ............................. H01S 3/133; H01S 3/098
[52] U.S. Cl. ................................... 372/25; 385/27; 372/6; 372/19; 372/32
[58] Field of Search .................................. 372/6, 25, 19, 372/32; 385/27, 24

[56] References Cited

U.S. PATENT DOCUMENTS

| | | | |
|---|---|---|---|
| 4,469,397 | 9/1984 | Shaw et al. | 385/27 |
| 4,839,898 | 6/1989 | Payne et al. | 372/6 |
| 4,938,556 | 7/1990 | Digonnet et al. | 385/27 |
| 5,181,213 | 1/1993 | Shinokura | 372/6 |
| 5,309,455 | 5/1994 | Adachi et al. | 372/25 |
| 5,359,612 | 10/1994 | Dennis et al. | 385/24 |

FOREIGN PATENT DOCUMENTS

| | | | |
|---|---|---|---|
| 0468826 | 7/1991 | European Pat. Off. | |
| 6003557 | 1/1994 | Japan | 385/24 |
| 6059127 | 3/1994 | Japan | 385/27 |

OTHER PUBLICATIONS

Electronics Letters, vol. 28, No. 3, Jan. 30, 1992, pp. 224–226, M. Cavalier et al. 'Picosecond Wavelength–tunable semiconductor laser pulses with . . . '.

Optics Letters, vol. 15, No. 12, Jun. 15, 1990, New York, pp. 715–717, M. Nakazawa et al. 'Transform–limited pulse generation in the gigahertz . . . '.

Proceedings of the 14th European Conference On Optical Communication, 11–15 Sep. 1988, Part I, pp. 320–323, H. Izadpanah, 'Picosecond optical pulse . . . '.

"Miniature packaged actively mode–locked semiconductor laser with tunable 20ps transform limited pulses", D. M. Bird et al., Electronic Letters, Dec. 6, 1990, vol. 26, No. 25, pp. 2086 and 2087.

"Switch inversion and polarization sensitivity of the non-linear loop mirror" N. Finlayson et al., Optics Letters, vol. 17, No. 2, (Jan. 1992), pp. 112–114.

Primary Examiner—Rodney B. Bovernick
Assistant Examiner—Robert McNutt
Attorney, Agent, or Firm—Pearne, Gordon, McCoy & Granger

[57] ABSTRACT

Method and device for generating optical pulses.

According to the invention, in order to generate an optical signal in the form of optical pulses, a semiconductor laser (2) is made to function as gain commutation, and a portion of the light produced by this laser is reinjected into the laser. The light to be reinjected is previously filtered by an optical filter (12) which is tuned to one of the modes of the laser. Another portion of the light produced by the laser is used as an optical signal after having been filtered this portion by the optical filter.

12 Claims, 2 Drawing Sheets

METHOD AND DEVICE FOR GENERATING OPTICAL PULSES

FIELD OF THE INVENTION

The present invention concerns a method and device for generating optical pulses.

BACKGROUND OF THE INVENTION

It is applicable to optical telecommunications and more particularly to digital transmissions by means of optical fibers, especially those which make the most of the solitons and/or wavelength multiplexing.

At the current moment, only semiconductor lasers are able to obtain extremely short optical pulses while being compatible with transmissions by optical fibers (with these lasers, it is possible to obtain high repetition frequencies and embody compact pulse generating devices).

Among the known techniques for generating optical pulses, two prove to be advantageous, especially for the transmission of information via the soliton effect, namely the technique using a semiconductor laser which functions in the locking mode, and the technique using a semiconductor laser which functions in gain commutation.

In the case of the technique using a laser which functions in the locking mode, the Fabry-Pérot type cavity of the laser is extended, that is its initial length Lo (about between 0.3 and 1 mm) is raised to L1 much higher than Lo (L1 about between 3 and 5 cm) so that the spacing Df of the lines of the Fabry-Pérot cavity is located in the range of frequencies of between about 2 and 5 GHz.

This is obtained by making one of the faces of the semiconductor laser undergo an antireflection treatment and by placing a mirror, or better still a reflecting diffraction network, at the distance L1 from the other face of the semiconductor laser.

The locking of modes is embodied by modulating the injection current of the amplifier medium of the laser at the frequency Df.

By making the diffraction network rotate, this laser may be rendered wavelength-tunable.

This type of optical pulse generator has two major drawbacks:
- the generator is relatively difficult to produce: the antireflection treatment needs to be of extremely good quality and the mechanical tolerances are extremely severe, or else this results in a lack Of sturdiness,
- the repetition frequency of the pulses is imposed by the length L1 of the extended cavity.

However, it is possible to render this length L1 variable as described in the following document:

Article by D. M. BIRD and al and entitlted "Miniature packaged actively mode-locked semiconductor laser with tunable 20 ps transform limited pulses" published in *Electronic Letters*, 6 Dec. 1990, vol 26, No 25, pp 2086–2087.

But the additional adjustment described in this article adds to the difficulty of embodying an optical pulse generator and increases the sensitivity of the latter to mechanical and external thermic stresses.

With regard to the known technique which uses a semiconductor laser functioning in gain commutation, this laser functions when the injection current of this laser is strongly and rapidly modulated with a clear passage of this injection current under the laser emission threshold.

Also, the relation between the modulation signal and the modulated optical power is distinctly non-linear which, under certain conditions, makes it possible to obtain extremely short optical pulses.

The advantages of gain commutation are its simplicity, the sturdiness and the possibility of continuously adjusting the repetition frequency over a wide range of frequencies.

The major drawback of this gain commutation technique resides in the presence of a high "chirp" (frequency fluctuation), that is a significant variation of the wavelength of the optical carrier wave during the pulse.

With a mono-mode laser (generally a DFB type laser), the "chirp" may be reduced by means of an optical treatment which generally makes use of a special optical fiber whose dispersion is negative, and/or an optical filter.

Another drawback of an optical pulse generator using gain commutation is that it is not tunable.

However, recently, a wavelength-tunable optical pulse generator using the principle of gain commutation has been described in the following document:

Article by M. Cavelier, N. Stelmakh, J. M. Xie, L. Chusseau, J. M. Lourtiog, C. Kazmierski and N. Boudma and entitled "Picosecond (<2.5 ps) Wavelength-Tunable (~20 nm/semiconductor laser pulses with repetition rates up to 12 GHz" published in *Electronic Letters* (1992), vol 28, No 3, pp 224–226.

The Fabry-Pérot type multi-mode semiconductor laser, which is used in the generator described in this document, is firstly rendered monomode, and secondly wavelength-tunable per pitch by means of a slight reinjection of the light filtered by a wavelength-tunable filter (the optical power reinjected into the laser is about one thousandth of the optical power produced by the latter or less).

However, the generator described in this article has a highly significant "chirp" which renders this generator unsuitable for transmissions by optical fibers causing the soliton phenomenon to intervene.

SUMMARY OF THE INVENTION

The object of the present invention is to provide a method and device for generating optical pulses which combine the advantages of the mode-locking technique, especially the spectral quality of the pulse (slight "chirp" with a selective mirror) and the advantages of the gain commutation technique (simplicity and sturdiness of the optical pulse generating device).

The method for generating an optical signal in the form of optical pulses of the present invention is characterized in that:
- a semiconductor laser is made to function in gain commutation,
- a large portion (that is, at least one hundredth) of the light produced by this laser is reinjected into the laser,
- the light to be reinjected is previously filtered by an optical filter which is tuned to one of the modes of the laser, and
- one portion of the light produced by the laser is used as an optical signal after having had this portion been filtered by the optical filter.

Thus, the present invention uses a semiconductor laser functioning in gain commutation so as to produce optical pulses, the optical frequency of this laser being locked by virtue of a significant reinjection of the optical power produced by this laser and filtered by the filter which is tuned to one of the modes of the laser (which is thus rendered monomode by this filter) and the optical power available (for usage) being also filtered by this same optical filter.

The invention differs from the known techniques mentioned earlier by the fact that it uses the reinjection of a high rate of the light filtered into a semiconductor laser which is applied to lasers with an extended cavity, still known as external cavity lasers (the laser used in the present invention does not undergo any anti-reflection treatment or is possibly subjected to a slight anti-reflection treatment so as to increase the amount of light leaving the laser).

The invention also differs from these known techniques by the fact that it effects filtering by the same filter of the light reinjected and the light available for subsequent usage, which is important so as to obtain optical pulses whose optical carrier wave is pure (almost without any "chirps").

By reinjecting a high rate of the filtered light and the use of a light filtered by the filter used for the light to be reinjected, the invention is able to obtain optical pulses whose optical spectral width is close to the theoretical limit corresponding to the Fourier transform of the detected pulse (such pulses being known as Transform Limited Optical Pulses in English publications).

It is to be noted that the reinjected light rate is higher when the "chirp" is weak.

The present invention also concerns a device for generating an optical signal in the form of optical pulses, this device being characterized in that it includes:

a semiconductor laser;

means for controlling the semiconductor laser and able to have this laser function in gain commutation, and supply and reinjection means provided to reinject into the laser a large portion of the light produced by this laser and provide as an optical signal one portion of the light produced by this laser, these supply and reinjection means including an optical filter tuned to one of the modes of the laser and which firstly filters the light to be reinjected and the light forming the optical signal.

According to a first particular embodiment of the device of the invention, the optical filter is reciprocal and the supply and reinjection means further include:

a 2×2 type optical coupler having 4 accesses, one of said accesses receiving the light produced by the laser, this light thus reaching two other accesses, and an optical fiber loop which connects these two other accesses to each other by means of the optical filter, the optical signal being available to the fourth access.

In these circumstances, the optical fiber loop forms a Sagnac interferometer.

The device of the invention may further include at least one polarization controller-which is inserted into the optical fiber loop.

This makes it possible to adjust the light reinjection rate.

Two polarization controllers are preferably used which are inserted into the optical fiber loop.

These controllers are preferably inserted on each side of the optical filter.

With the polarization controller(s), it is preferable to use an optical coupler whose coupling coefficient is 0.5 which makes it possible to make the reflection rate vary from between 0 and 100% (and thus the transmission rate) of the mirror formed by the optical fiber loop.

According to a second particular embodiment of the invention, the supply and reinjection means further include:

a 2×2 type optical coupler having four accesses with one receiving the light produced by the laser, this light thus reaching two of the other accesses, an optical isolator, and an optical fiber loop which connects these two other accesses to each other by means of the optical isolator and the optical filter, the isolator and filter being inserted in the loop so as to only allow the light circulating in this loop to pass, the optical signal being available to the fourth access.

According to a third particular embodiment of the device of the invention, the supply and reinjection means further include:

an optical coupler with at least three accesses, one access being optically connected to the front face of the semiconductor laser so as to receive the light coming from this front face and then arriving at the other two accesses, one of said accesses being optically connected to the rear face of the laser so as to reinject there a large portion of the light coming from the front face, whereas the other provides the optical signal, and an optical isolator, this isolator and the optical filter being inserted in the optical link between the front face of the laser and the optical coupler.

The optical filter used in the present invention may be tuned solely once on one of the lines of the Fabry-Pérot cavity of the semiconductor laser, but preferably this optical filter is wavelength-tunable, which makes it possible to pass from one line to another and thus obtain wavelength-tunable optical pulses.

Finally, the semiconductor laser control means may include:

an electric pulse generator, a polarization T which is constituted by a condensor and an inductive resistor and by means of which the laser connected to this generator, and an electric isolator which is placed between the generator and the polarization T and which differentiates the electric pulses produced by the generator.

This makes it possible to improve the shape of the optical pulses generated and reduce the width of these pulses.

BRIEF DESCRIPTION OF THE DRAWINGS

The present invention shall be more readily understood from a reading of the following description of embodiments given purely by way of non-restrictive illustration with reference to the accompanying drawings on which.

DETAILED DESCRIPTION OF THE PREFERRED EMBODIMENTS

Figure 1:
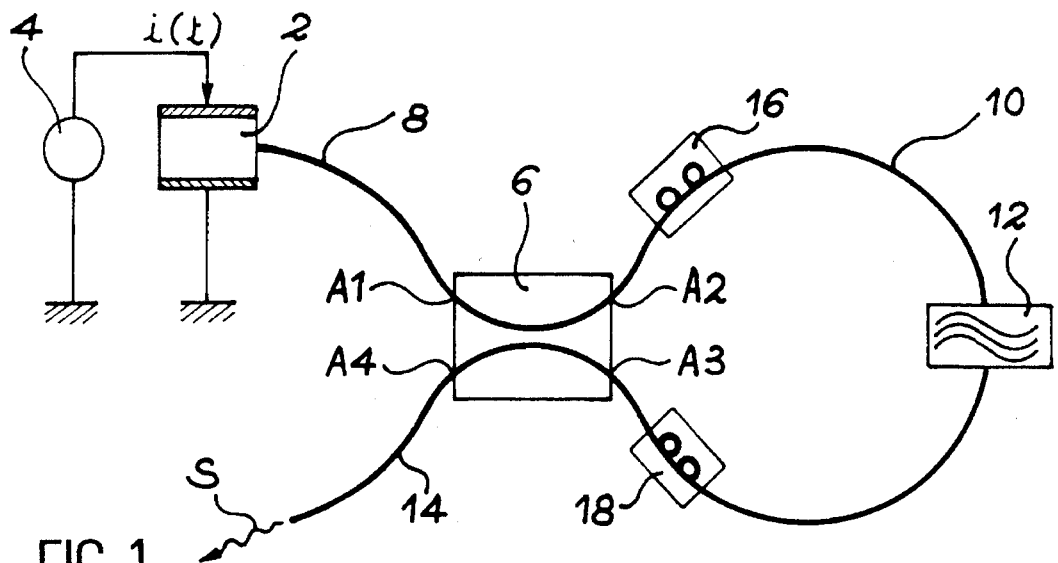
FIG. 1 is a diagrammatic view of one particular embodiment of the device of the invention and which includes an optical fiber loop forming a Sagnac interferometer.

FIG. 1 is a diagrammatic view of a device conforming to the invention which is particularly advantageous by virtue of its simplicity.

This device includes a semiconductor laser 2 or laser diode, and means 4 for controlling this laser diode and provided to make the laser diode function in gain commutation.

These control means 4 send the laser diode 2 an injection current whose variations i(t) according to the time t allow for gain commutation functioning, this current being applied to the laser diode 2 by means of one of the two electrodes of the latter, whereas the other electrode of this laser diode is earthed or grounded.

The device of FIG. 1 also includes a 2×2 type optical coupler whose four accesses bear the references A1, A2, A3 and A4 respectively on FIG. 1.

The optical pulses generated by the laser diode functioning in gain commutation and originating from the front face of this laser diode (which may be a DFB type laser) are sent to the access A1 of the coupler 6 by means of an optical fiber 8.

Each optical pulse generated is then divided into two pulses according to the coupling coefficient of the optical coupler 6 (0a1) and these two pulses arrive respectively at the accesses A2 and A3 of the coupler 6.

The device of FIG. 1 also includes an optical fiber loop 10 which connects the access A2 to the access A3 of the coupler 6 by means of an optical filter 12.

This optical filter is reciprocal (that is, it acts in the same way on a light which passes through it in a direction as well as on a light which passes through it in the other direction) and this filter is preferably wavelength-tunable (for example, a tunable Fabry-Pérot filter is used).

The two pulses resulting from the division of the incident optical pulse pass through the optical filter loop in directions opposite each other, traverse the optical filter 12 and are recombined in the optical coupler 6.

A major portion of the light resulting from this recombination is reinjected into the laser 2 by means of the optical fiber 8, whereas another portion of this light is available at the access A4 of the optical coupler 6.

An optical fiber 14 may be connected to this access A4 so as to transport the optical signal S obtained towards the use means of this signal (not shown).

The optical filter loop 10 forms a Sagnac interferometer:

If the optical filter loop does not contain any double refractive element and if the non-linear effects are ignored, the optical power coming out via the access A4 of the optical coupler with respect to the optical power entering via the access A1 of the coupler is equal to:

$$1-4a(1-a)$$

and the optical power which comes out via the access A1 of the coupler with respect to the optical power entering via the access A1 of the coupler is equal to:

$$4a(1-a)$$

When a is equal to 0.5 (coupler 50%–50%), all the optical power is reflected towards the laser diode and nothing comes out via the access A4.

Thus, it can be seen that the coupling coefficient a of the optical coupler 6 allows for adjustment of the level of the optical power reinjected into the laser diode, this coupling coefficient being set at the time the optical coupler 6 is produced.

One way of varying the reflection rate (and thus the transmission rate) of the mirror formed by the optical filter loop is to insert in this loop at least one polarization controller but preferably two polarization controllers 16 and 18 which are placed close to the accesses A2 and A3 respectively of the coupler and connected, if required, by the same optical fiber length to these accesses A2 and A3, as can be seen on FIG. 1.

In this respect, reference may be made to the following document:

Article by N. Finlayson, B. K. Noyar and N. J. Doran and entitled "Switch inversion and polarization sensitivity of the nonlinear loop mirror" published in *Optics Letters*, vol. 17, No 2, (1992), pp. 112–114.

The use of a polarization controller or controllers makes it possible to dynamically optimize the functioning of the optical pulse generating device.

The laser diode 2 is directly modulated by the injection current.

For modulation frequencies greater than or equal to 2 GHz, the modulation is a sinusoidal type modulation.

For modulation frequencies of less than 2 GHz, the modulation is a pulse type modulation.

So as to obtain optical self-locking, it is necessary to synchronize the signal modulating the laser diode with the reinjected optical pulses.

This requires that the modulation frequency F is an integral multiple of the quantity Fo=1/T where T is the time between the emission of an optical pulse from the laser diode and the reinjection of this pulse into this laser diode.

A synchronization precision equal to about 20% of the width at mid-amplitude tm of the reinjected optical pulses has been experimentally determined which makes it possible to evaluate the stability and/or the precision of the modulation frequency F.

For example, if F=5 GHz, T=100 ns (which corresponds to a loop of about 20 m of optical fiber) and tm=40 ps, the precision concerning F is then equal to $2\times10^{-4}$ GHz, this precision and stability being easily obtained.

In this example, the frequency pitch Fo is equal to 10 MHz.

This pitch Fo may be adjusted according to requirements by acting on the length of the optical filter loop which makes it possible to obtain extremely fine pitches.

The minimum width of the generated optical pulses depends on a large number of factors, the main ones being the laser diode production technique, the control circuit of this laser diode, the polarization current and the amplitude of the modulation of this current.

The optical pulses may be temporarily enlarged via a selection of the pass-range of the optical filter.

As seen earlier, the use of a wavelength-tunable optical filter makes it possible to wavelength-tune the optical pulses.

The wavelengths available are those of the Fabry-Pérot cavity of the laser diode.

However, by acting on the temperature of this laser diode, it is possible to move the lines of its Fabry-Pérot cavity and then continuously render this laser diode tunable.

A variation of 10° C. is normally sufficient.

For low repetition frequencies (normally less than 2 GHz), it is necessary to modulate the laser diode 2 by high amplitude current pulses as short as possible.

Figure 2A:
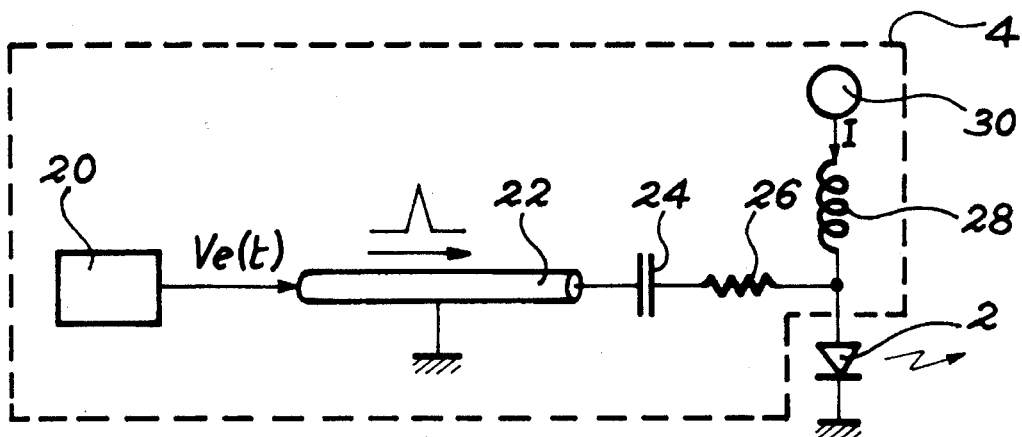
FIG. 2A is a diagrammatic view of means able to be used in a device conforming to the invention for controlling the semiconductor laser forming part of this device.

In order to achieve this, it is possible to use the control means 4 diagrammatically shown on FIG. 2A and including an SRD (Step Recovery Diode) generator 20 which is connected to the laser diode 2 by means of a coaxial transmission line 22 and a polarization T constituted by a capacitor 24, an adaptation resistor 26 and an inductive resistor 28, the latter being associated with a current source 30 which provides a polarization current I.

The output impedance of the generator 20 is time-variable and distanced from the characteristic impedance of the transmission line (50 ohms).

The adaptation resistance may be equal to 45 ohms.

On FIG. 2A, Ve(t) represents the voltage applied to the input of the core of the transmission line 22 by the generator 20 (with respect to the ground), a voltage which varies during the time t.

Figure 2B:
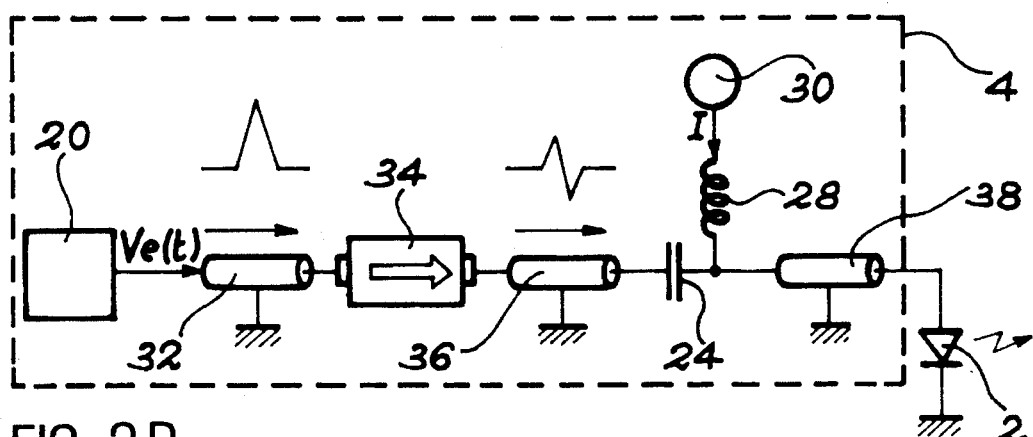
FIG. 2B is a diagrammatic view of other means used in preferance to the preceding ones for controlling this semiconductor laser.

FIG. 2B shows the control means 4 which are used in preference to the means shown on FIG. 2A.

The control means shown on FIG. 2B include the generator 20 of FIG. 2A which feeds the laser diode 2 successively by means of a first coaxial transmission line 32, an electric isolator 34, a second coaxial transmission line 36, a polarization T constituted by the capacitor 24 and the inductive resistor 28 associated with the current source 30 (the adaptation resistance is suppressed), and a third coaxial transmission line 38.

In the case of FIG. 2B, the electric pulses issued from the generator 20 are differentiated by the electric isolator 34 whose pass-band is adapted to the width of these pulses so as to be able to differentiate them (typically 1 octave).

The rear portion of each electric pulse coming out of this isolator 34 is then negative, which makes it possible to empty more quickly the carriers of the active zone of the laser diode 2 and thus obtain narrower optical pulses and more symmetrical than with the control means of FIG. 2A.

The fact of differentiating an electric control pulse reduces the amplitude of this electric pulse.

The suppression of the adaptation resistance makes it possible to properly mitigate this drawback.

In these circumstances, the current in the laser diode is multiplied by two for a given voltage available at the outlet of the generator 20.

Moreover, the suppression of this adaptation resistance makes it possible to reduce the parasitic cabling elements.

As the differentiating element here is an electric isolator, the reflections generated by the mismatching of the laser diode are almost eliminated.

Thus, the fact of suppressing the adaptation resistance of the laser diode and introducing an electric isolator with an appropriate pass-band makes it possible to improve the shape of the optical pulses generated and reduce the width of these optical pulses.

Other particular embodiments can be used to reinject the filtered light.

Figure 3:
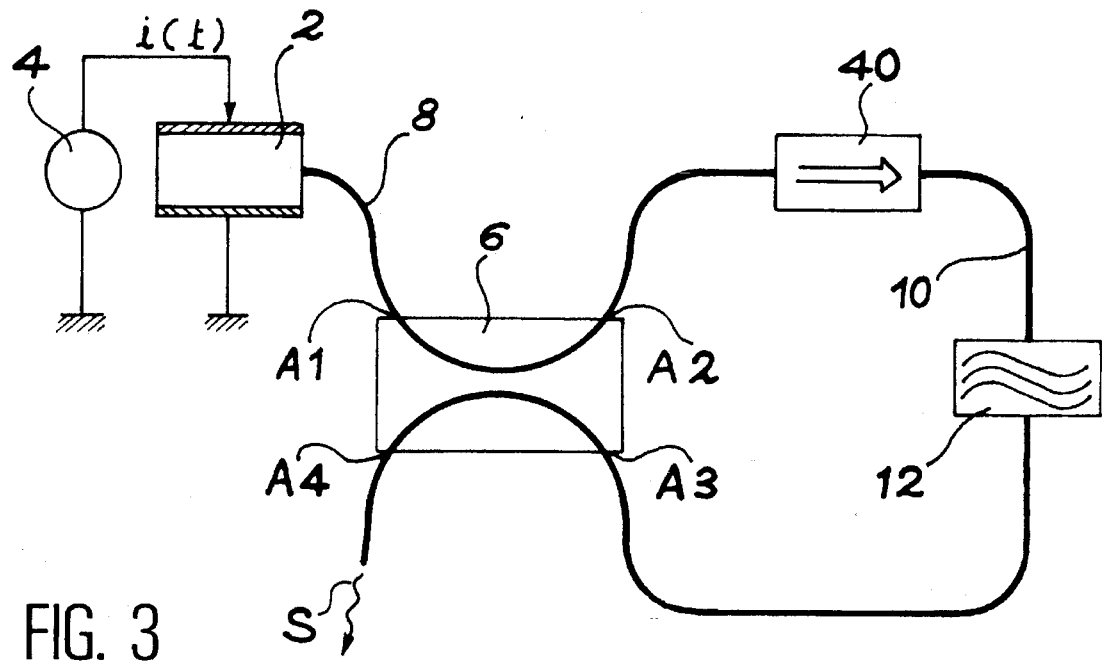
FIG. 3 is a diagrammatic view of another particular embodiment of the device of the invention and which uses an optical fiber loop in which an optical isolator is inserted.

The particular embodiment of the device of the invention, which is diagrammatically shown on FIG. 3, is identical to the one of FIG. 1 except an optical isolator 40 is inserted in the optical filter loop 10 which no longer functions as a Sagnac interferometer (the polarization controller(s) is/are also suppressed).

As can be seen on FIG. 3, the optical isolator 40 is mounted so that the light circulates in the optical filter loop 10 by moving from the access A2 to the access A3 of the optical coupler 6.

With the device of FIG. 3, the ratio of the intensity of the light reinjected into the laser diode 2 to the intensity of the light available at the access A4 of the coupler is solely controlled by the coefficient a of this coupler.

Figure 4:
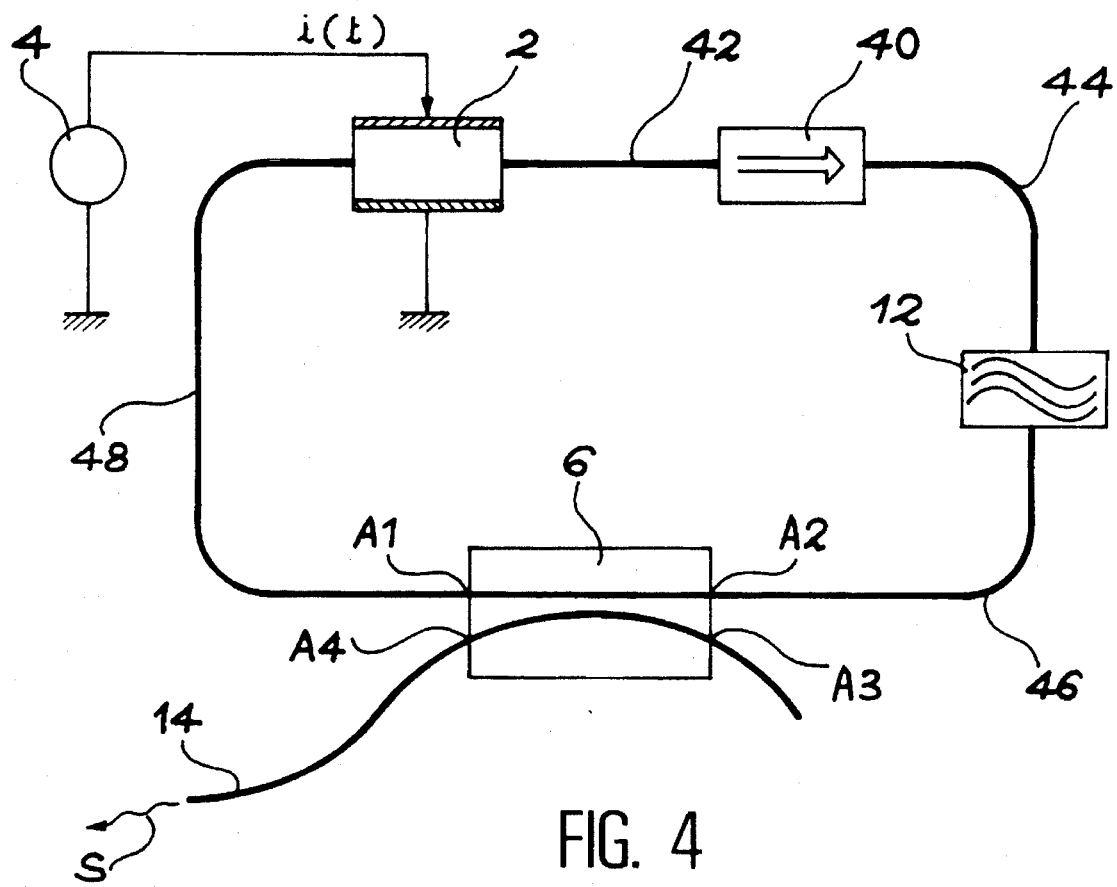
FIG. 4 is a diagrammatic view of another particular embodiment in which the light produced by the semiconductor laser is reinjected into the latter via the rear face of said laser.

The particular embodiment diagrammatically shown on FIG. 4 corresponds to the case where the reinjection of the filtered light is effected via the rear face of the laser diode 2 (in the case where both the front and rear faces of the laser diode are accessible).

More specifically, the device diagrammatically shown on FIG. 4 includes:

the laser diode 2 which is controlled by the means 4, the optical filter 12 which receives the light coming from the front face of the laser diode 2 successively by means of an optical fiber 42, the optical isolator 40 (suitably orientated) and another optical fiber 44, the optical coupler 6 whose access A2 receives the light coming out of the optical filter 12 by means of an optical fiber 46, the access A1 therefore being connected to the rear face of the laser diode 2 by means of an optical fiber 48 so as to reinject there a large portion of the light produced by this laser diode.

The access A4 of the optical coupler 6 is further connected to an optical fiber 14 for transporting the optical signal S produced, whereas the access A3 of this coupler is unconnected.

It is therefore possible to replace the optical coupler 6 by a Y-coupler with three accesses (the two branches of the fork of the Y corresponding to the accesses A1 and A4 respectively).

The optical fibers used in the present invention may be standard optical fibers or optical fibers with polarization holding.

These latter fibers make it possible to obtain better stability in the case of functioning in a "difficult" environment (for example, mechanical impacts or stresses exerted on the optical fibers).

What is claimed is:

1. A method for generating an optical signal in the form of optical pulses, said method comprising the steps of:

providing a semiconductor laser adapted to function in gain commutation;

filtering light produced by said laser by an optical filter which is tuned onto a mode of the laser;

reinjecting a first portion of the light produced by the laser back into said laser after filtering by the optical filter; and using a second portion of the light produced by the laser as an optical signal after filtering by the optical filter, wherein the first and second portions of the light produced by the laser undergo the same filtering.

2. Method according to claim 1, wherein said laser is a conventional semiconductor laser having highly reflective end faces.

3. A device for generating an optical signal in the form of optical pulses, said device comprising:

a semiconductor laser for producing light;

means for controlling the semiconductor laser suitably adapted for making said laser function in gain commutation; and supply and reinjection means for reinjecting a first portion of the light produced by said laser back into said laser and supplying a second portion of the light produced by said laser as an optical signal, said supply and reinjection means including an optical filter which is tuned onto a mode of the laser and which filters the light to be reinjected and the light forming the optical signal, wherein the first and second portions of the light produced by the laser undergo the same filtering.

4. The device according to claim 3, wherein said optical filter is reciprocal and said supply and reinjection means further include:

a 2×2 type optical coupler having four accesses, one of said accesses being optically connected to said laser by transport means to receive the light produced by the laser, this light arriving at two other of said accesses; and an optical filter loop having transport means which optically connects said two other of said accesses to each other and said optical filter in said transport means connecting said two other of said accesses, said optical signal being available at the fourth of said accesses.

5. The device according to claim 4, wherein said optical filter loop has at least one polarization controller in said transport means connecting said two other of said accesses.

6. The device according to claim 5, wherein said optical filter loop has two polarization controllers.

7. The device according to claim 6, wherein said optical coupler has a coupling coefficient of 0.5.

8. The device according to claim 3, wherein said supply and reinjection means further include:

a 2×2 type optical coupler having four accesses, one of said accesses being optically connected to said laser by transport means to receive the light produced by the laser, this light arriving at two other of said accesses; and an optical filter loop having transport means which optically connects said two other of said accesses to each other, an optical isolator, and said optical filter, said optical isolator and said optical filter being in said transport means connecting said two other of said accesses so as to allow the light which circulates in said optical filter loop to pass in only one direction, said optical signal being available at the fourth of said accesses.

9. The device according to claim 3, wherein said supply and reinjection means further include:

an optical coupler with at least three accesses, one of said accesses being optically connected by transport means to front face of the semiconductor laser so as to receive the light coming from said front face, this light then arriving at the other two of said accesses, one of said other two of said accesses being optically connected to rear face of the laser so as to reinject there a portion of the light coming from the front face, whereas the other of said other two of said accesses provides said optical signal; and an optical isolator, said optical isolator and said optical filter being in said transport means connecting the front face of the laser and the optical coupler.

10. The device according to claim 3, wherein said optical filter is wavelength-tunable.

11. The device according to claim 3, wherein said means for controlling the semiconductor laser include:

an electric pulse generator;

a polarization T including a capacitor and an inductive resistor through which the laser is connected to said generator; and an electric isolator between the generator and the polarization T which differentiates the electric pulses produced by the generator.

12. Device according to claim 3, wherein said laser is a conventional semiconductor laser having highly reflective end faces.

* * * * *

UNITED STATES PATENT AND TRADEMARK OFFICE
CERTIFICATE OF CORRECTION

PATENT NO. : 5,477,555
DATED : December 19, 1995
INVENTOR(S) : Debeau et al.

It is certified that error appears in the above-identified patent and that said Letters Patent is hereby corrected as shown below:

```
Column 1, line 13, delete "the" (second occurrence); and
          line 49, delete "Of" and insert --of--.

Column 3, line 52, delete "-" (dash).

Column 5, line 22, delete "(0a1) and insert --(0≤a≤1)--;
          line 58, delete "a" and insert --a--; and
          line 61, delete "a" and insert --a--.

Column 6, line 36, delete "2 x 10⁻⁴" and insert --2 x 10⁻⁴--.

Column 7, line 62, delete "a" and insert --a--.

Column 10, line 5, (Claim 9, line 5), before "front" insert
          --a--; and
          line 8, (Claim 9, line 8), after "to" insert --a--.
```

Signed and Sealed this

Eleventh Day of June, 1996

Attest:

BRUCE LEHMAN

*Attesting Officer*  *Commissioner of Patents and Trademarks*